(12) United States Patent
Hwu

(10) Patent No.: US 7,057,476 B2
(45) Date of Patent: Jun. 6, 2006

(54) NOISE SUPPRESSION METHOD FOR WAVE FILTER

(75) Inventor: Keh-Long Hwu, Hsinchu (TW)

(73) Assignee: Industrial Technology Research Institute (TW)

(*) Notice: Subject to any disclaimer, the term of this patent is extended or adjusted under 35 U.S.C. 154(b) by 108 days.

(21) Appl. No.: 10/853,873

(22) Filed: May 25, 2004

(65) Prior Publication Data

US 2005/0140465 A1    Jun. 30, 2005

(30) Foreign Application Priority Data

Dec. 30, 2003  (TW) .............................. 92137395 A

(51) Int. Cl.
*H03H 9/15* (2006.01)
*H03H 9/54* (2006.01)

(52) U.S. Cl. ...................... 333/187; 333/189; 310/312; 310/320

(58) Field of Classification Search ........ 333/187–189; 310/312, 320
See application file for complete search history.

(56) References Cited

U.S. PATENT DOCUMENTS 5,495,135 A * 2/1996 Zimnicki et al. ........... 310/312
5,519,279 A * 5/1996 Zimnicki ..................... 310/363
5,903,087 A * 5/1999 Mattson et al. ............. 310/365
6,215,375 B1 * 4/2001 Larson et al. ............... 333/187
6,492,759 B1 * 12/2002 Watanabe .................... 310/320
6,657,363 B1 * 12/2003 Aigner ........................ 310/324
6,812,619 B1 * 11/2004 Kaitila et al. ............... 310/320

FOREIGN PATENT DOCUMENTS

WO     WO 99/59244    * 11/1999

* cited by examiner

*Primary Examiner*—Barbara Summons
(74) *Attorney, Agent, or Firm*—Morland C. Fischer

(57) ABSTRACT

A noise suppression method of a wave filter used to eliminate standing wave signal interferences in the acoustic wave filter consisted by a plurality of film bulk acoustic resonators (FBARs). The method is to provide a plurality of scatterers in the structured consisted by the FBARs, thereby creating an band-gap structure due to the material characteristics difference, which consequently generates a destructive interfering effect to the transverse higher harmonics vibration within a specific operating frequency range, and ultimately decreases or even eliminates any parasitic effects. Therefore, within the operation frequency range of this band-gap structure, abnormal signals created by any transverse wave modes cannot exist. In addition, an acoustic shield can be provided by phononic crystal structures between different FBARs, thus acoustic shielding any mutual interference within the operation frequency range.

29 Claims, 4 Drawing Sheets

NOISE SUPPRESSION METHOD FOR WAVE FILTER

FIELD OF THE INVENTION

The present invention relates to a noise suppression technique, and more particularly, to a noise suppression method that forms a plurality of scatterers in the structure of film bulk acoustic resonators, thereby allowing destructive interfering effect to be applied to transverse higher harmonics vibration due to the band-gap structure generated by characteristics difference between materials used.

DESCRIPTION OF THE PRIOR ART

For conventional crystal wave filters used in VHF and HF bands under 300 MHz, the upper limit of operating frequency is mainly restricted by accuracy of the crystal thickness thinning process, which suppresses the rising of operating frequency. Nowadays, micro-electro-mechanical system (MEMS), combined with accurate control of sputtering film thickness, are used to obtain crystal-filer-structure alike thin Film Bulk Acoustic Resonators (FBARs), the resonant frequency of which can be raised to several GHz to tens of GHz. In recent years, many research and development of wireless communication products focus on volume and cost reduction, such as the integration of RF chips to reduce the number of elements, or the design of miniaturized RF wave filters etc.

FIG. 1 shows a conventional FBAR 110, at the central of the structure is a piezoelectric film 111, the upper and lower surfaces of which are plated with conductive materials to form working electrodes 112a and 112b, a acoustic resonant cavity consists of a region overlapping the upper and lower electrodes 112a and 112b and the piezoelectric film 111; under the influence of an external electric field, the electrode-overlapping region of the piezoelectric film converts a portion of the external electric field energy into mechanical field energy due to its piezoelectric effect. In order to obtain the maximum mechanical convertible efficiency, FBARs usually utilize a thickness excitation mode for mechanical-electrical conversion. The fundamental resonant frequency of FBARs occurs when half the wavelength of the input frequency equals the thickness of the piezoelectric film, and its acoustic wave propagation mode, such as compression wave mode, plate wave mode, or shear wave mode, are all vertical to the upper and lower working electrodes.

However, considering the applications of the actual elements, apart from the longitudinal wave propagation modes vertical to the working electrodes, there will also be transverse wave propagation modes generated by transverse strain owing to discontinuity boundaries between walls of the acoustic resonant cavity defined by the electrodes or surfaces of the electrodes of the FBARs and the air. Although the fundamental resonant frequency of those acoustic waves propagating transversely to the electrode surfaces and the piezoelectric film is well below the fundamental resonant frequency along the thickness direction of the piezoelectric film, the higher harmonics vibration of those transverse acoustic waves is able to reach the range of fundamental resonant frequency along the thickness direction. Besides, in conventional design of a thin film bulk acoustic wave filter, the upper and lower working electrodes 112a and 112b of the acoustic resonant cavity are rectangular with opposite sides parallel to each other. This type of geometry causes the transversely propagated acoustic waves to generate serious standing wave effect, as such the energy absorbed is far less, since irregularities of electrical effects, such as spikes, are produced by those transverse higher harmonics. Although the external energy absorbed due to these abnormal harmonics effects is not high, it still creates numerous problems in regard to circuit design for RF wave filters.

In order to suppress the said transverse resonance, U.S. Pat. No. 6,215,375 discloses irregularly shaped polygons, as shown in FIGS. 2 and 3. The acoustic resonant cavities 200 and 300 in FIGS. 2 and 3 respectively are n-polygons (n=3, 4, . . . ) with any two sides of the working electrodes not parallel to each other. This design improves transverse standing wave effects in the conventional rectangular working electrodes from two aspects. First, when any two sides of the working electrodes are not parallel to each other, acoustic wave from any one point of the acoustic resonant cavity would reflect several times before returning to its original starting point, in so doing the effective propagation path length increases significantly, which means in the operating frequency of the FBAR, transverse standing waves have to raise to higher band mode number for their higher harmonics vibrations to interfere with the thickness fundamental frequency of the FBARs. Second, when the transverse resonant modes are equal, their amplitudes are multiplied, which is called the "degenerate energy level". For rectangular working electrodes, the parallel walls of the acoustic resonant cavity result in equal resonant paths for any two opposite points at each side, which subsequently worsen the multiplication effect of the degenerate energy level, thereby interfering spikes are formed in the fundamental operating frequency of the FBARs. If any two sides of the working electrodes are not parallel, the transverse acoustic waves propagation paths of any two points on the acoustic resonant cavity will not be equal in length. Therefore, at any two points, the harmonic transverse mode propagation frequencies derived from the same thickness resonant mode will not be the same. The above US patent further cited that the designed structure disclosed therein is able to lower, by 10 times, the degenerate energy level created by the higher harmonics vibrations of the same frequency. Simply, the said patent can only lower the abnormal signals produced by transverse mode higher harmonics vibrations, but cannot eliminate it completely.

SUMMARY OF THE INVENTION

In order to solve the problems of the prior art, a primary objective of the present invention is to provide a noise suppression method for a wave filter, which utilizes a material structural design to solve the standing wave signal interference found in conventional FBARs.

Another objective of the present invention is to provide a noise suppression method for a wave filter, which completely eliminates the abnormal signals, such as the transverse propagating acoustic waves, caused by the transverse-mode higher harmonics vibration without the need to change to the shape of the acoustic resonant cavity.

In order to achieve the above objectives, the present invention provides a noise suppression method for wave filter; the method arranges a plurality of scatterers in the FBARs, by utilizing the characteristics variation between the scatterers and the thin film bulk material, an band gap similar to the band gap of photonic crystals, called phononic band gap, can be created. These scatterers produce a destructive interfering effect to transverse higher harmonics vibration within the operating frequency range, thus any transverse propagating acoustic waves, whether it is the wave vector or the resonant mode thereof, cannot exist in the operating frequency range. Therefore, the present invention can completely eliminate abnormal signals created by any transverse mode; unlike the prior art, where energy of the transverse spikes is only partly reduced.

According to the above, the FBARs provided by the noise suppression method for a wave filter of the present invention can be constructed by air-bridge structures on a substrate or in front-side/backside etched cavity. In addition, these scatterers can be periodically or randomly formed as cylinders or voids in the overlap of working electrodes and piezoelectric film (i.e. the acoustic resonant cavity) of the FBARs structure. The scatterers can also be formed in the regions not overlapped by the working electrodes and the piezoelectric film or even in the whole piezoelectric film.

BRIEF DESCRIPTION OF THE DRAWINGS

A better understanding of the present invention can be obtained when the detailed description is considered in conjunction with the following drawings, in which.

DETAILED DESCRIPTION OF THE PREFFERED EMBODIMENT

The descriptions below of specific embodiments are to illustrate the present invention. Others skilled in the art can easily understand the advantages and effectiveness of the present invention from contents disclosed in this specification. The present invention can be carried out or applied through other different embodiments. Every details of this specification can be modified based on different viewpoints and applications yet still within the scope of the present invention, for example, modify the arrangement or position of the scatterers etc.

Embodiments below further describe the viewpoints of the present invention, but it is not intended in any way to limit the scope of the present invention.

In the following embodiments, the noise suppression method of the present invention is applied in a thin film bulk acoustic wave filter, in order to eliminate the abnormal signals generated by the transverse wave propagating modes in the film bulk acoustic wave filter, as well as creating an acoustic shielding effect against transverse acoustic wave resonance generated at operating frequency by neighboring film bulk acoustic wave filter. However, firstly it should be noted that the noise suppression method of the present invention does not limit to be used only in film bulk acoustic wave filter; broadly speaking, the present invention can be applied to any device that requires elimination of noise spikes generated by transverse strain vibration of the acoustic resonant cavity, in this manner, quality factor Q can be improved and noise interference reduced, i.e. higher spectral purity. Furthermore, the phononic crystal structures between different FBARs can also form an acoustic shield to prevent interferences in operating frequency from occurring.

Figure 1:
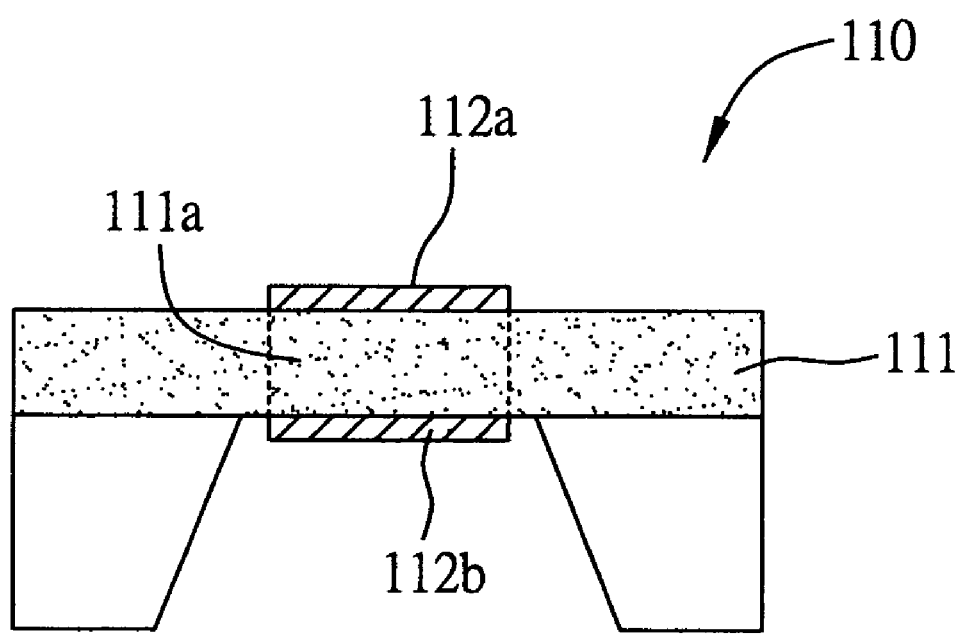
FIG. 1 is a cross sectional view of a conventional film bulk acoustic resonator (FBAR)
Figure 2:
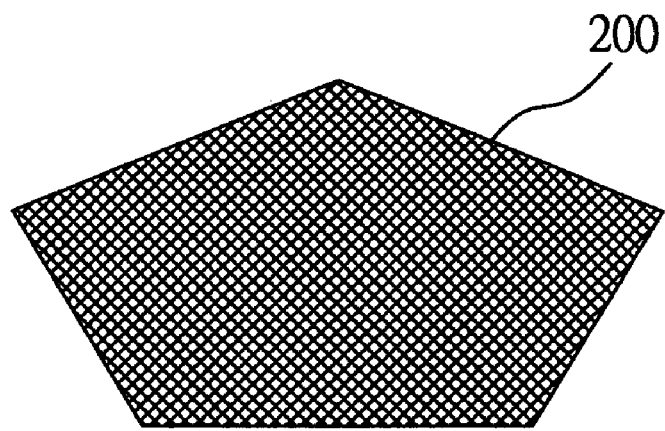
FIG. 2 and FIG. 3 show diagrams of irregular polygons of resonant acoustic cavities.
Figure 3:
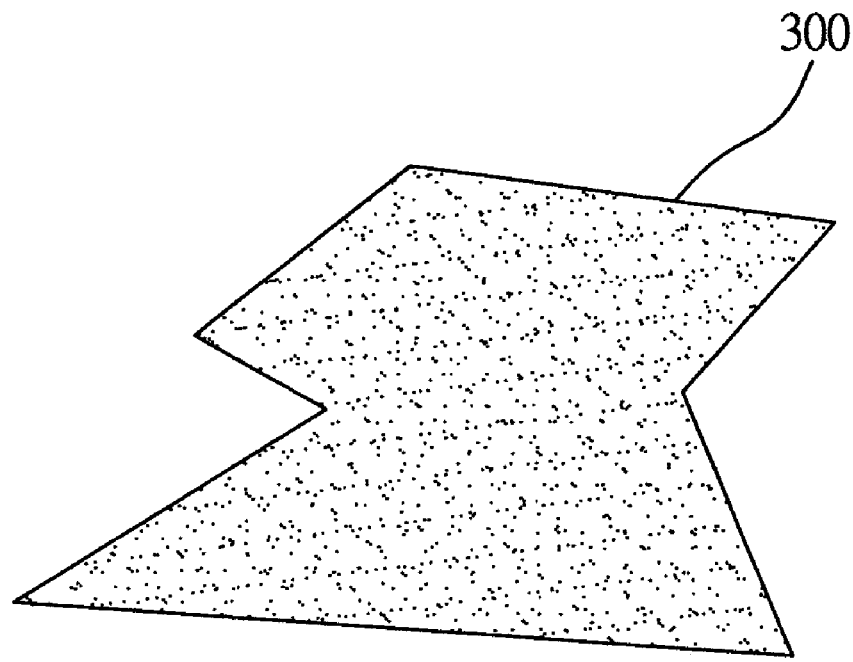
Figure 4:
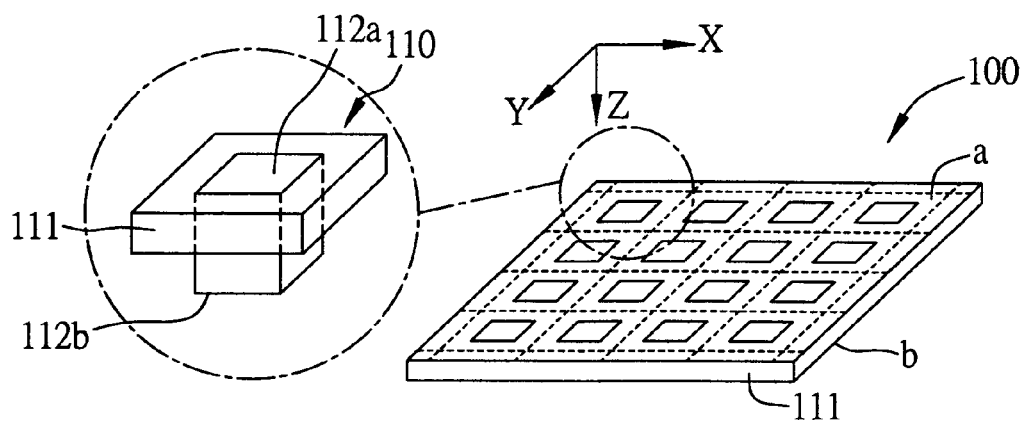
FIG. 4 to FIG. 7 are oblique 3-dimensional diagrams of film bulk acoustic wave filters, used to illustrate various aspects of a plurality of scatterers provided therein.

FIG. 4 is an oblique diagram showing the appearance of a film bulk acoustic wave filter 100. As shown in the FIG., the film bulk acoustic wave filter 100 is constructed with a plurality of film bulk acoustic resonators (FBARs) 110, at the centre of the structure is a piezoelectric film 111, it can be a mechanical-electrical convertible film material, such as Aluminium Nitride (AlN), lead zirconate titanate (PZT), lead lanthamum zirconium titanate (PLZT), Cadium Sulphide (CdS), Gallium Arsenide (GaAs), and Zinc Oxide (ZnO) etc, and a first surface a and second surface b of the piezoelectric film 111 are plated with conductive materials, which can be a meta film material, such as Aluminium (Al), Gold (Au), and Molybdenium (Mo), that form into a plurality of working electrodes 112a and 112b blocks; wherein, the region overlapping the piezoelectric film 111 and the working electrodes 112a and 112b is a major active region, used as an acoustic resonant cavity.

The FBARs 110 of the present invention is provided by arranging a plurality of scatterers (not shown) with different mechanical characteristics in the acoustic resonant cavity of the piezoelectric film 111. These scatterers can be periodically or randomly arranged along 1-dimensional, 2-dimensional, or 3-dimensional directions, which have random geometries at the cross section of the x-y plane, the elastic wave or wave propagation mode of x-y plane in the acoustic resonant cavity allowable depends on the periodic arrangement of the composite structure, such as square lattice, triangle lattice, honeycomb lattice or any other forms of periodic arrangement and other parameters such as the average density of each face, average elastic modulus ratio and density ratio between different materials, geometry of the scatterers and filling fraction etc.

Figure 5:
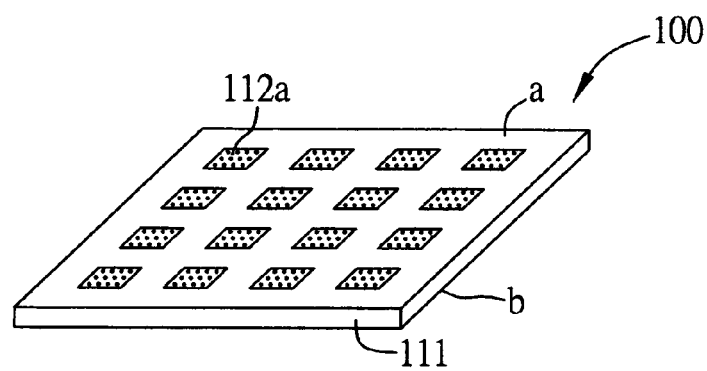
Figure 6:
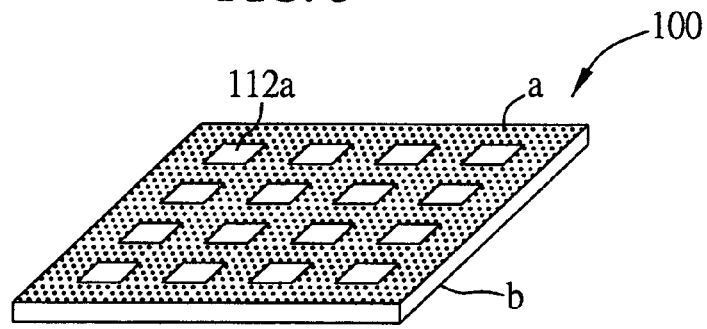
Figure 7:
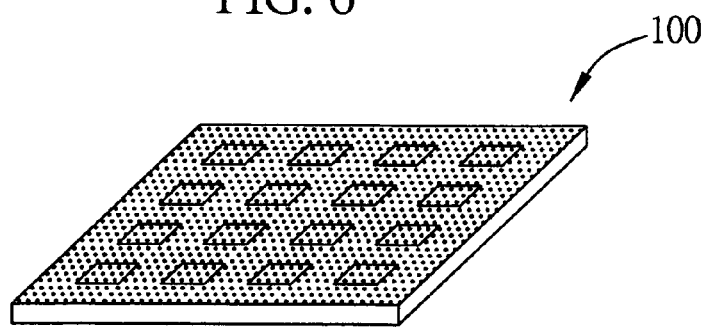

The scatterers provided in the FBARs 110 according to the method of the present invention are mainly realized in three ways: one is to provide the scatterers in the region of the piezoelectric film 111 overlapped by the upper and lower working electrodes 112a and 112b (i.e. the acoustic resonant cavity), as shown by the black dots on the working electrodes 112a representing the scatterers in FIG. 5; another other way is to provide the scatterers in the region of piezoelectric film 111 not overlapped by the upper and lower working electrodes 112a and 112b, as shown in FIG. 6; the third way is to provide the scatterers on the regions of piezoelectric film 111 overlapped and not overlapped by upper and lower electrodes 112a and 112b, as shown in FIG. 7. In addition, the scatterers can be geometric cylinders penetrating through the piezoelectric film 111 or voids formed on the surfaces of the working electrodes or the piezoelectric film, they can be arranged periodically or randomly. Further, the FBARs 110 can be constructed as air bridges on the substrate or on frontside or backside etched cavity.

Figure 8:
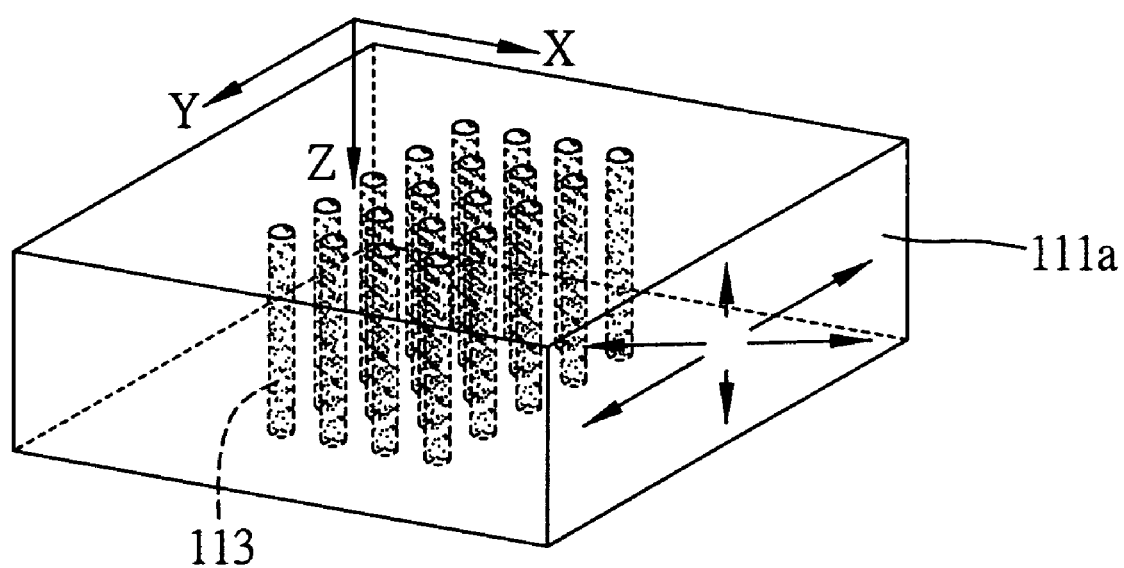
FIG. 8 is an oblique 3-dimensional diagram of a film bulk acoustic wave filter, used to illustrate a plurality of scatterers arranged in a periodically manner therein.

In this embodiment, the noise suppression method of the present invention is illustrated in details by the cylindrical scatterers periodically arranged in the region of the piezoelectric film 110 overlapping the upper and lower working electrodes 112a and 112b along the 2-dimensional plane (x-y plane). FIG. 8 is an oblique 3-D diagram showing a plurality of cylindrical scatterers 113 provided in the acoustic resonant cavity 11a according to the noise suppression method of the present invention. As shown in the FIG., the acoustic resonant cavity 111a itself is a part of the piezoelectric film 111 structure, but since it is a overlapping region of the piezoelectric film 111,and the upper and lower working electrodes 112a and 112b, it thus becomes the major active region of the FBAR 110 and as the acoustic resonant cavity 11a. When external electric field is applied, a portion of the external electric field energy is converted to mechanical field energy due to piezoelectric effect, thus creating resonant phenomenon through such a mechanical-electrical conversion. Since air impedance matching is not possible, a majority of the acoustic wave energy remains in the FBAR 110. In this embodiment, the present invention periodically arranges the cylindrical scatterers 113 along the 2-dimensional plane (x-y plane), utilizing the structural difference between the cylindrical scatterers 113 and the piezoelectric film 111 (i.e. acoustic resonant cavity 111a), band-gap structure can be formed. When necessary, the inner of the cylindrical scatterers 113 can be also be filled with material that raises the structural difference. Thus a band gap similar to the band gap of the photonic crystals can be designed, called phononic band gap. In the range of this band gap, any transverse acoustic waves, be it wave vector or resonant mode cannot exist. When external electric field along the thickness direction (i.e. z direction) of the FBARs 110 applies a potential energy to the working electrodes 112a and 112b, any higher harmonics vibration of the transverse propagating acoustic waves generated via piezoelectric coupling or Poisson ratio coupling of the piezoelectric film 111, scattering effect may be produced owing to the elastic difference between the piezoelectric material and the air cylinders. According to the operating frequency set for elements, the ratio between radius of the air cylinders and lattice constant, and the periodic arrangement of the air cylinders, any resonant propagating modes transversally excited along the x-y plane declines exponentially owing to the destructive scattering effect. According to the above frequency band blocking design, signals generated in the thickness direction are not affected by any transverse mode interferences.

In conclusion, a plurality of scatterers are periodically arranged in the acoustic resonant cavity according to the noise suppression method of the present invention, and by utilizing the band-gap structure generated due to the material difference between the interfering structural arrangement and the piezoelectric film (acoustic resonant cavity), any transverse acoustic waves is destructively interfered by the scatterers within the frequency range of the said band gap. Consequently, detrimental parasitic effects can be reduced or eliminated completely. In addition, according this kind of high Q value and low interfering FBAR, high performance and low phase noise signal generators, oscillators, and microwave RF wave filters can be designed. In another aspect, the said forbidding phenomenon exhibited by the band gap of acoustic waves will not only eliminate the interference of the transverse acoustic resonance in the acoustic resonant cavity, acoustic shielding can be provided against other transverse acoustic waves generated by neighboring FBARs within the operating frequency range.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A noise suppression method for a wave filter, the wave filter being provided with at least one film bulk acoustic resonator (FBAR), a piezoelectric film being located at the center of the FBAR, the piezoelectric film having an upper surface and a lower surface, said upper and lower surfaces being plated with conductive material to be used as an upper working electrode and a lower working electrode, respectively, wherein a region overlapping the piezoelectric film and the upper and lower working electrodes forms an acoustic resonant cavity, the noise suppression method comprising at least the following steps of:

selecting the region overlapping the piezoelectric film and the upper and lower working electrodes in the structure of the FBAR; and providing a plurality of noise scatterers in the structure embodied by the region, wherein said noise scatterers are filled with material that increases a material characteristic difference and a cross section of the scatters is of a random geometrical shape.

2. The method as claimed in claim 1, wherein the noise scatterers are hollow cylindrical structures penetrating the piezoelectric film to connect together the upper and lower working electrodes.

3. The method as claimed in claim 1, wherein the noise scatterers are void structures located on the surfaces of the upper and lower working electrodes.

4. The method as claimed in claim 1, wherein the conductive material with which said upper and lower surfaces are plated is a metal film material.

5. The method as claimed in claim 4, wherein the metal film material is one of Aluminum (Al), Gold (Au), and Molybdenum (Mo).

6. The method as recited in claim 1, wherein the piezoelectric film is a mechanical-electrical convertible film material.

7. The method as claimed in claim 6, wherein the mechanical-electrical convertible film material consists of one of Aluminum Nitride (AlN), lead zirconate titanate (PZT), lead lanthanum zirconium titanate (PLZT), Cadmium Sulphide (CdS), Gallium Arsenide (GaAs), and Zinc Oxide (ZnO).

8. The method as claimed in claim 1, wherein the noise to be suppressed comprises transverse waves produced by transverse strain vibration of the acoustic resonant cavity.

9. The method as claimed in claim 1, wherein the noise scatterers are arranged into a periodic array or are randomly arranged.

10. The method as claimed in claim 1, wherein the FBAR is constructed as an air bridge on a substrate, on a frontside or backside etched cavity or a Bragg acoustic reflector.

11. A noise suppression method for a wave filter, the wave filter being provided with at least one film bulk acoustic resonator (FBAR), a piezoelectric film being located at the center of the FBAR, the piezoelectric film having an upper surface and a lower surface, said upper and lower surfaces being plated with conductive material to be used as upper working electrode and a lower working electrode, respectively, wherein a region overlapping the piezoelectric film and the upper and lower working electrodes forms an acoustic resonant cavity, the noise suppression method comprising at least the following steps of:

selecting a the region not overlapping the piezoelectric film and the upper and lower working electrodes in the structure of the FBAR; and providing a plurality of noise scatterers in the structure embodied by said region, wherein said noise scatterers are filled with material that increases a material characteristic difference and a cross section of the scatterers is of a random geometrical shape.

12. The method as claimed in claim 11, wherein the noise scatterers are arranged into a periodic array or are randomly arranged.

13. The method as claimed in claim 11, wherein the FBAR is constructed as an air-bridge on the a substrate, or in a front-side and backside etched cavity or a Bragg acoustic reflector.

14. The method as claimed in claim 11, wherein the noise to be suppressed comprises transverse waves produced by transverse strain vibration of the acoustic resonant cavity.

15. The method as claimed in claim 11, wherein the conductive material with which said upper and lower surfaces are plated is a metal film material.

16. The method as claimed in claim 15, wherein the metal film material is one of Aluminum (Al), Gold (Au), and Molybdenum (Mo).

17. The method as claimed in claim 11, wherein the piezoelectric film is a mechanical-electrical convertible film material.

18. The method as claimed in claim 17, wherein the mechanical-electrical convertible film material consists of one of Aluminum Nitride (AlN), lead zirconate titanate (PZT), lead lanthanum zirconium titanate (PLZT), Cadmium Sulphide (CdS), Gallium Arsenide (GaAs), and Zinc Oxide (ZnO).

19. A noise suppression method of for a wave filter, the wave filter being provided with at least one film bulk acoustic resonator (FBAR), a piezoelectric film being located at the center of the FBAR, the piezoelectric film having an upper surface and a lower surface, said upper and lower surfaces being plated with conductive material to be used as an upper working electrode and a lower working electrode, respectively, wherein a region overlapping the piezoelectric film and the upper and lower working electrodes forms an acoustic resonant cavity, the noise suppression method comprising at least the following step of:
providing a plurality of noise scatterers over the entire piezoelectric film.

20. The method as claimed in claim 19, wherein the noise scatterers are filled with material that increases a material characteristic difference and a cross section of the scatterers is of a random geometrical shape.

21. The method as claimed in claim 19, wherein the noise scatterers are arranged into a periodic array or are randomly arranged.

22. The method as claimed in claim 19, wherein the FBAR is constructed as an air-bridge on a substrate, or in a front-side and backside etched cavity or a Bragg acoustic reflector.

23. The method as claimed in claim 19, wherein the noise to be suppressed comprises transverse waves produced by transverse strain vibration of the acoustic resonant cavity.

24. The method as claimed in claim 19, wherein the noise scatterers are hollow cylindrical structures penetrating the piezoelectric film to connect together the upper and lower working electrodes.

25. The method as claimed in claim 19, wherein the noise scatterers are void structures located on the upper and lower working electrodes.

26. The method as claimed in claim 19, wherein the conductive material is a metal film material.

27. The method as claimed in claim 26, wherein the metal film material is one of Aluminum (al), Gold (Au), and Molybdenum (Mo).

28. The method as claimed in claim 19, wherein the piezoelectric film is a mechanical-electrical convertible film material.

29. The method as claimed in claim 28, wherein the mechanical-electrical convertible film material consists of one of Aluminum Nitride (AlN), lead zirconate titanate (PZT), lead lanthanum zirconium titanate (PLZT), Cadmium Sulphide (CdS), Gallium Arsenide (GaAs), and Zinc Oxide (ZnO).

* * * * *